(12) United States Patent
Yakoo et al.

(10) Patent No.: US 9,330,976 B2
(45) Date of Patent: May 3, 2016

(54) WAFER PROCESSING METHOD

(71) Applicant: DISCO CORPORATION, Tokyo (JP)

(72) Inventors: Susumu Yakoo, Tokyo (JP); Hiroyuki Takahashi, Tokyo (JP); Kenji Okazaki, Tokyo (JP); Yoshiteru Nishida, Tokyo (JP); Tomotaka Tabuchi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/817,366

(22) Filed: Aug. 4, 2015

(65) Prior Publication Data

US 2016/0042996 A1 Feb. 11, 2016

(30) Foreign Application Priority Data

Aug. 5, 2014 (JP) .................................. 2014-159840

(51) Int. Cl.
*H01L 21/00* (2006.01)
*H01L 21/78* (2006.01)
*H01L 21/02* (2006.01)
*H01L 21/3065* (2006.01)
*H01L 21/308* (2006.01)

(52) U.S. Cl.
CPC .......... *H01L 21/78* (2013.01); *H01L 21/02013* (2013.01); *H01L 21/02016* (2013.01); *H01L 21/02019* (2013.01); *H01L 21/02057* (2013.01); *H01L 21/3065* (2013.01); *H01L 21/3083* (2013.01)

(58) Field of Classification Search
CPC .............. H01L 21/78; H01L 21/02019; H01L 21/02013; H01L 21/02016; H01L 21/02057
See application file for complete search history.

(56) References Cited

U.S. PATENT DOCUMENTS 9,082,839 B2 * 7/2015 Gauldin et al.

FOREIGN PATENT DOCUMENTS

JP 2006-114825 4/2006

* cited by examiner

*Primary Examiner* — Richard Booth
(74) *Attorney, Agent, or Firm* — Greer Burns & Crain Ltd.

(57) ABSTRACT

A wafer processing method includes forming a resist film on the front side of a wafer in an area except division lines, plasma etching the wafer to form a groove on the front side of the wafer along each division line, the groove having a depth greater than a finished thickness, removing the resist film from the front side of the wafer by cleaning, and grinding the back side of the wafer to reduce the thickness of the wafer to the finished thickness, so that the groove is exposed to the back side of the wafer to thereby divide the wafer into individual device chips. In the resist film removing step, a chemical fluid is sprayed to the resist film formed on the front side of the wafer, thereby removing the resist film.

3 Claims, 7 Drawing Sheets

WAFER PROCESSING METHOD

BACKGROUND OF THE INVENTION

1. Field of the Invention

The present invention relates to a wafer processing method such as plasma dicing.

2. Description of the Related Art

Usually, a dicing saw or a laser processing apparatus is used to divide a semiconductor wafer. The dicing saw performs a crushing action and accordingly tends to cause chipping of the wafer. Accordingly, the dicing saw has a problem that the die strength of each chip obtained by dividing the wafer is reduced. The dicing saw has another problem that the processing time is relatively long. On the other hand, the laser processing apparatus has such a merit that chipping is less caused in cutting the wafer and the width of a cut area is very small. However, since the chips (devices) are arranged close to each other, there is a problem such that the chips may come into contact with each other during transfer of the wafer to the subsequent step, causing chipping.

To cope with these problems, there has been proposed a processing method (plasma dicing) of dividing a wafer into individual chips by using plasma etching (see Japanese Patent Laid-open No. 2006-114825, for example). This processing method has a merit such that even when the diameter of the wafer is large, the processing time for formation of grooves on the wafer is hardly increased and the die strength of each chip can be improved. In the plasma dicing described in Japanese Patent Laid-open No. 2006-114825, each device not to be etched is preliminarily protected by a resist film, and only the division lines are subjected to plasma etching to thereby form a division groove along each division line. After finishing the plasma etching, the resist film is removed to expose the devices. Usually, the removal of the resist film modified by the plasma etching is performed by ashing (dry etching) using oxygen plasma.

SUMMARY OF THE INVENTION

However, the method described in Japanese Patent Laid-open No. 2006-114825 has a possibility that each device including metal and resin such as polyimide may be damaged by ashing (dry etching) in removing the resist film. Further, as another method of removing the resist film, there is a method including the steps of performing ashing so that the resist film is slightly left and next using a chemical fluid to remove the resist film slightly left above. Thusly, the method described in Japanese Patent Laid-open No. 2006-114825 uses a dry etching apparatus or a chemical fluid in removing the resist film, causing an increase in cost and man-hour.

It is therefore an object of the present invention to provide a wafer processing method which can remove the resist film at a low cost without causing damage to the devices.

In accordance with an aspect of the present invention, there is provided a wafer processing method of processing a wafer having a plurality of devices each formed in a plurality of separate regions defined by a plurality of crossing division lines on the front side of the wafer, the wafer processing method including a resist film forming step of forming a resist film on the front side of the wafer in an area except the division lines; a plasma etching step of performing plasma etching to the wafer after performing the resist film forming step, thereby forming a groove on the front side of the wafer along each division line, the groove having a depth greater than a finished thickness; a resist film removing step of removing the resist film from the front side of the wafer by cleaning after performing the plasma etching step; and a grinding step of holding the wafer on a chuck table in the condition where the back side of the wafer is exposed after performing the resist film removing step, and grinding the back side of the wafer held on the chuck table to reduce the thickness of the wafer to the finished thickness, whereby the groove is exposed to the back side of the wafer to thereby divide the wafer into a plurality of individual device chips each corresponding to the devices, wherein the resist film removing step includes the step of spraying a chemical fluid to the resist film formed on the front side of the wafer, thereby removing the resist film.

Preferably, alcohol is used as the chemical fluid.

Alternatively, dimethyl sulfoxide, N-methyl pyrrolidone, or dipropylene glycol methyl ether may be used as the chemical fluid.

According to the wafer processing method of the present invention, the resist film can be removed by a very simple operation of spraying the chemical fluid in the resist film removing step after performing the plasma etching step. Accordingly, the resist film can be removed at a low cost without causing damage to the devices.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations to be described below may be suitably combined. Further, the configurations may be variously omitted, replaced, or changed without departing from the scope of the present invention.

Figure 1:
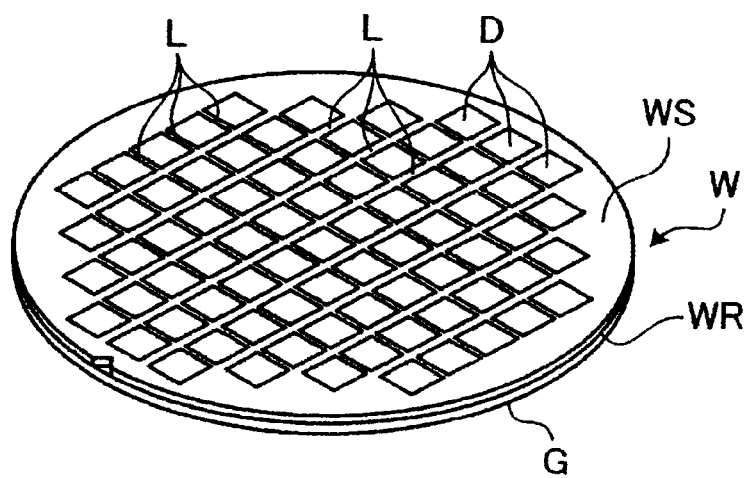
FIG. 1 is a perspective view of a wafer processed by a protective member attaching step.

The wafer processing method (which will be hereinafter referred to simply as processing method) according to this preferred embodiment is a method of processing a wafer W shown in FIG. 1. More specifically, the processing method according to this preferred embodiment is a method of dividing the wafer W into a plurality of device chips DT (see FIG. 8) each including a plurality of devices D. The wafer W as a workpiece to be divided into the individual device chips DT by the processing method according to this preferred embodiment is a disk-shaped semiconductor wafer or optical device wafer formed from a substrate of silicon, sapphire, or gallium arsenide, for example. As shown in FIG. 1, the wafer W has a front side WS and a back side WR. A plurality of crossing division lines L are formed on the front side WS of the wafer W to thereby define a plurality of separate regions where the plural devices D are each formed. Further, a functional layer including a low-permittivity insulator film (low-k film) is formed on the front side WS of the wafer W. The devices D are formed by the functional layer. Examples of the low-k film include an inorganic film of SiOF, BSG (SiOB), etc. and an organic film such as a polymer film of polyimide, parylene, etc.

The processing method according to this preferred embodiment includes a protective member attaching step, resist film forming step, plasma etching step, resist film removing step, grinding step, and tape attaching step.

Referring to FIG. 1, the protective member attaching step is the step of attaching a protective member G (hard substrate) on the back side WR of the wafer W, wherein the back side WR is opposite to the front side WS where the devices D are formed. The protective member G has substantially the same size as that of the wafer W. The protective member G is formed of a hard material and has a circular shape substantially equal in size to that of the wafer W. As shown in FIG. 1, the protective member G is attached to the back side WR of the wafer W in the protective member attaching step. After performing the protective member attaching step, the resist film forming step is performed.

Figure 2:
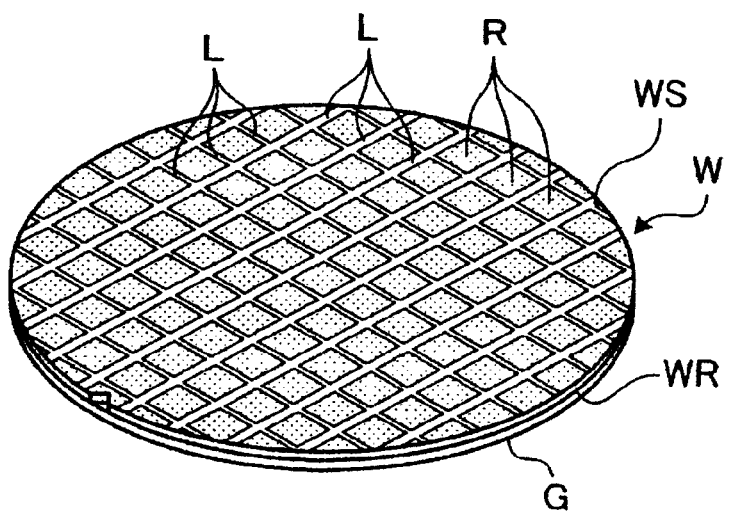
FIG. 2 is a perspective view of the wafer processed by a resist film forming step.

Referring to FIG. 2, the resist film forming step is the step of forming a resist film R on the front side WS of the wafer W in an area except the division lines L. The resist film R is formed of a material having corrosion resistance to an etching gas in the plasma etching step to be performed later. For example, the resist film forming step includes the steps of forming the resist film R on the front side WS of the wafer W in all the area, forming a negative or positive mask corresponding to the division lines L, exposing the resist film R through the mask to light, and developing the resist film R to remove the resist film R from the division lines L. In the condition after performing the resist film forming step, the division lines L are exposed to the front side WS of the wafer W, and the area (i.e., the devices D) except the division lines L is covered with the resist film R. Thereafter, the plasma etching step is performed.

Figure 3:
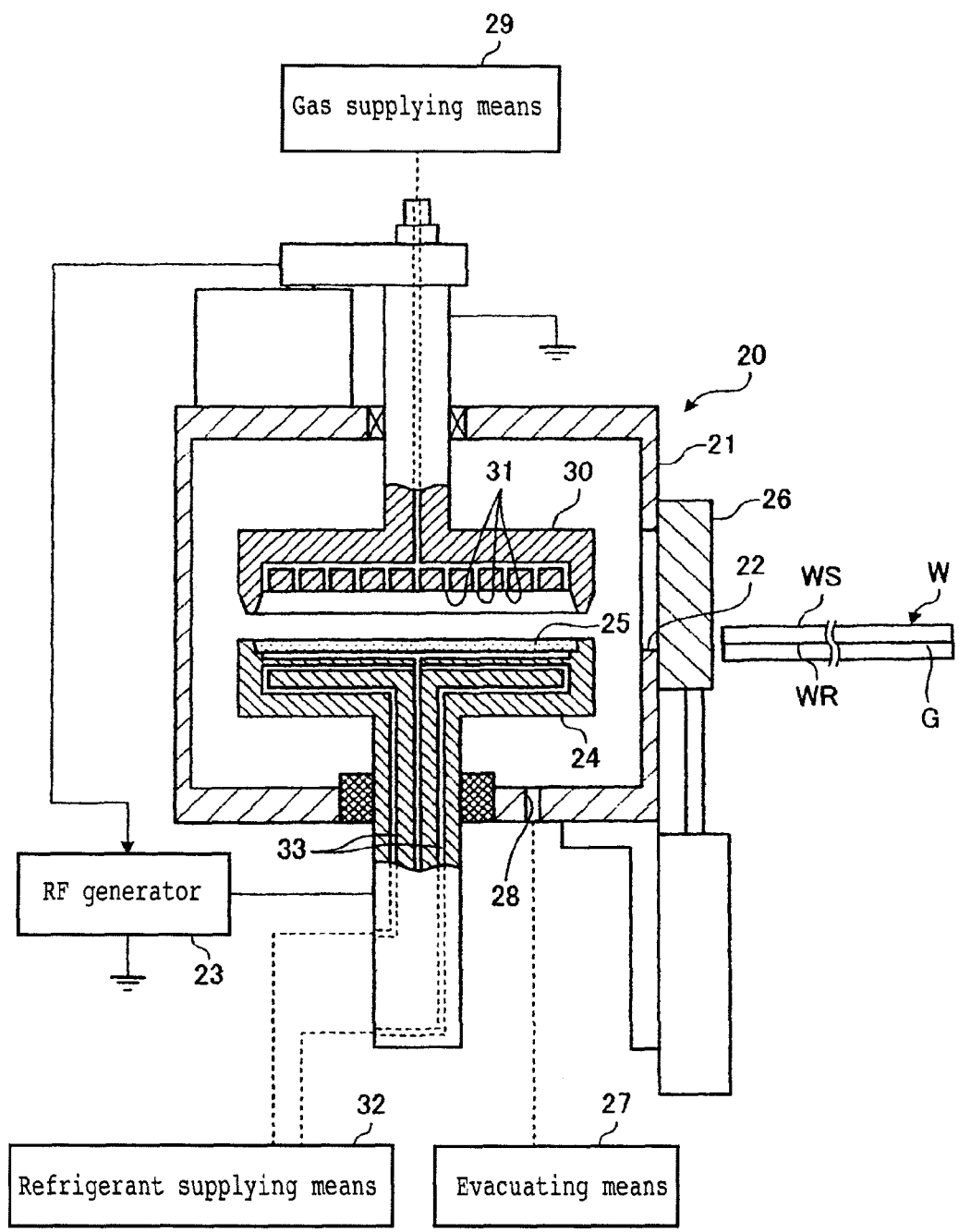
FIG. 3 is a partially sectional block diagram showing the configuration of a plasma etching apparatus to be used in a plasma etching step.
Figure 4:
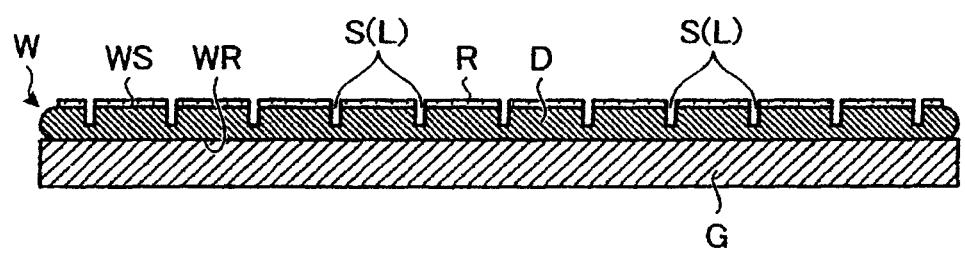
FIG. 4 is a sectional view of the wafer processed by the plasma etching step.

Referring to FIG. 3, the plasma etching step is the step of performing plasma etching to the wafer W processed by the resist film forming step. For example, the plasma etching step is performed by using a plasma etching apparatus 20 shown in FIG. 3. The plasma etching apparatus 20 has a housing 21 having an opening 22. The wafer W is first loaded through the opening 22 into the housing 21. The wafer W is next held on a suction holding member 25 provided on the upper surface of a lower electrode 24. The lower electrode 24 is connected to a radio frequency (RF) generator 23. The wafer W is held on the suction holding member 25 under suction in the condition where the back side WR of the wafer W is in contact with the suction holding member 25 via the protective member G. Thereafter, the opening 22 is closed by a gate 26. Thereafter, refrigerant supplying means 32 is operated to circulate a refrigerant in a cooling passage 33 formed in the lower electrode 24, and evacuating means 27 is operated to evacuate the housing 21 through an evacuation hole 28. Thereafter, gas supplying means 29 is operated to supply an etching gas into the housing 21 through a plurality of nozzle holes 31 formed in an upper electrode 30. The upper electrode 30 is also connected to the RF generator 23. The etching gas is discharged from the nozzle holes 31 toward the front side WS of the wafer W. At this time, the pressure in the housing 21 is maintained at a predetermined pressure. In the condition where the etching gas is discharged, the RF generator 23 is operated to apply RF power to the lower electrode 24 and the upper electrode 30. As a result, a plasma discharge is generated between the lower electrode 24 and the upper electrode 30, thereby etching the division lines L on the front side WS of the wafer W. Accordingly, as shown in FIG. 4, a groove S is formed along each division line L on the front side WS of the wafer W, wherein the groove S has a depth greater than a finished thickness T (see FIG. 8).

The etching gas to be used in the plasma etching step is suitably selected according to the material of the wafer W. For example, in the case that the material of the wafer W is silicon, $SF_6$, $NF_3$, or $XeF_2$ may be used as the etching gas. In this preferred embodiment, the wafer W is formed of silicon. The plasma etching step in this preferred embodiment is performed under the following conditions. The pressure in the housing 21 is maintained at 25 Pa (gauge pressure), and the power frequency of the RF generator 23 is set to 13.56 MHz. Helium gas as the refrigerant is supplied from the refrigerant supplying means 32 and circulated in the cooling passage 33 under a pressure of 2000 Pa (gauge pressure) to cool the lower electrode 24 to 10° C.

In this plasma etching step, an etching step and a protective film deposition step are alternately repeated. That is, in the etching step, $SF_6$ as the etching gas is supplied at a flow rate of 400 sccm (standard cc/minute), and an RF power of 2500 W is applied to the upper electrode 30, whereas an RF power of 150 W is applied to the lower electrode 24. In the protective film deposition step, $C_4F_8$ as the etching gas is supplied at a flow rate of 400 sccm, and an RF power of 2500 W is applied to the upper electrode 30, whereas an RF power of 50 W is applied to the lower electrode 24. Thus, the etching step and the protective film deposition step are alternately repeated by a so-called Bosch process to etch the division lines L on the front side WS of the wafer W, thereby forming the groove S having a constant width along each division line L.

In such a plasma etching step using the Bosch process, the etching step and the protective film deposition step are alternately repeated. In the etching step, the division lines L are etched at a high rate. In the protective film deposition step, a fluorocarbon film as a protective film is deposited on the inner surface of the groove S previously etched. Accordingly, the wafer W can be etched at a high rate with a high aspect ratio.

As described above, in the plasma etching step, the groove S is formed along each division line L on the front side WS of the wafer W by the Bosch process, wherein the groove S has a depth greater than the finished thickness T of the wafer W and has a constant width. In the plasma etching step using the Bosch process, the protective film is formed on the inner surface of each groove S in the protective film deposition step. Accordingly, although the side surface of each device D is exposed in the etching step, etching of the side surface can be suppressed. After forming the groove S along each division line L, the housing 21 is evacuated by operating the evacuating means 27. Thereafter, the resist film removing step is performed.

Figure 5:
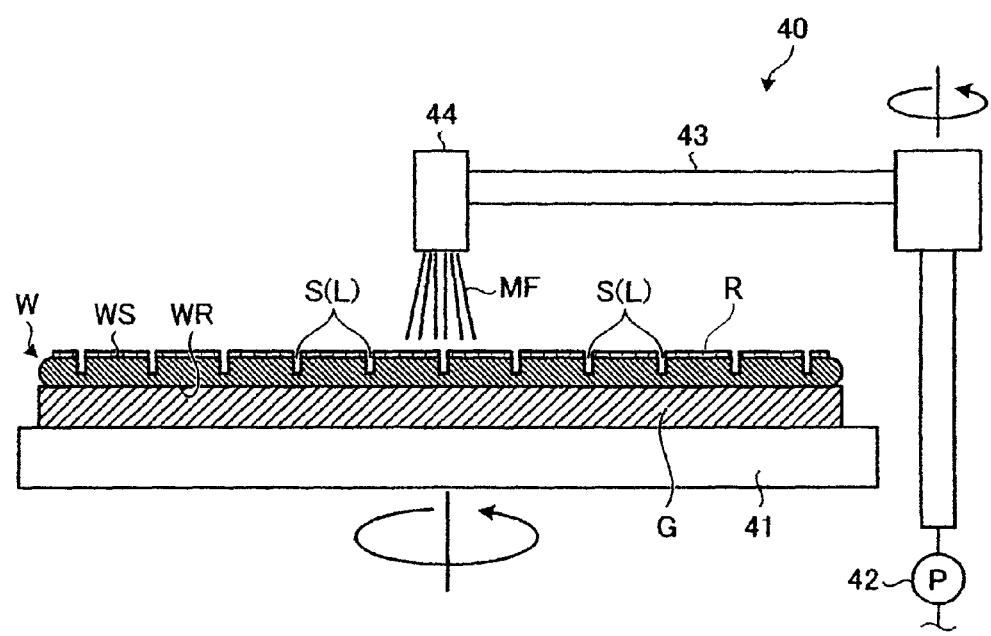
FIG. 5 is a partially sectional side view showing a resist film removing step.
Figure 6:
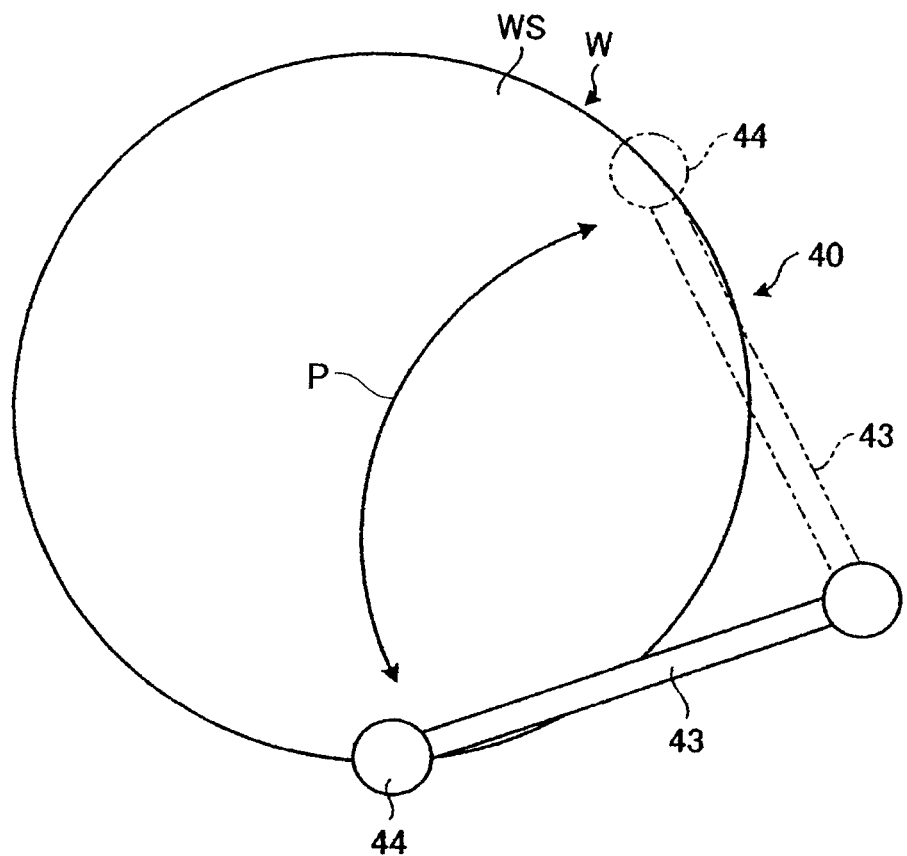
FIG. 6 is a schematic plan view showing the resist film removing step.

Referring to FIG. 5, the resist film removing step is the step of removing the resist film R covering the front side Ws of the wafer W by cleaning after performing the plasma etching step. The resist film removing step in this preferred embodiment is performed by using a resist film removing apparatus 40 shown in FIG. 5. The resist film removing apparatus 40 includes a chuck table 41 for holding the wafer W under suction, a pump 42 for supplying a chemical fluid MF, and a chemical fluid nozzle 43 having a nozzle head 44 for spraying the chemical fluid MF. First, the wafer W is placed on the chuck table 41 in the condition where the protective member G is in contact with the upper surface of the chuck table 41. Thereafter, the wafer W is held under suction on the chuck table 41. Thereafter, the chuck table 41 is rotated about its axis, and the pump 42 is operated to supply the chemical fluid MF from a chemical fluid tank (not shown) to the chemical fluid nozzle 43. The chemical fluid MF thus supplied to the chemical fluid nozzle 43 is sprayed from the nozzle head 44 provided at the front end of the chemical fluid nozzle 43 toward the front side WS of the wafer W. At this time, as shown by an arrow P in FIG. 6, the chemical fluid nozzle 43 is swung by a motor (not shown) between a first position shown by a solid line in FIG. 6 and a second position shown by a phantom line in FIG. 6 in such a manner that the nozzle head 44 passes through the center of the rotation of the wafer W held on the chuck table 41. The first position of the solid line and the second position of the phantom line in FIG. 6 are defined as the positions where the nozzle head 44 is opposed to the outer circumference of the wafer W held on the chuck table 41. In FIG. 6, the grooves S and the resist film R are not shown. As described above, in the resist film removing step, the chemical fluid MF is sprayed to the resist film R formed on the front side WS of the wafer W, thereby removing the resist film R from the front side WS of the wafer W.

In the resist film removing step, it is desirable to reduce the pressure of the chemical fluid MF acting on the wafer W, thereby suppressing damage to the devices D. In this respect, the pump pressure of the pump 42 is preferably adjusted to spray the chemical fluid MF in a conical form such that the column of the chemical fluid MF is diverged toward the front side WS of the wafer W. Accordingly, it is possible to increase the area of a portion where the column of the chemical fluid MF sprayed strikes on the front side WS of the wafer W, so that a throughput can be improved and the time required for the resist film removing step can be suppressed. In the case that a cleaning force for removing the resist film R is needed to be improved, the pump pressure of the pump 42 may be adjusted to spray the chemical fluid MF in a cylindrical form such that the column of the chemical fluid MF is fixed in thickness.

In this preferred embodiment, alcohol such as IPA (isopropyl alcohol) is used as the chemical fluid MF. Other examples of the chemical fluid MF usable in the present invention include dimethyl sulfoxide, N-methyl pyrrolidone, and dipropylene glycol methyl ether. These examples are chemicals conventionally used to remove a resist film slightly left after asking. For example, the resist film removing step in this preferred embodiment is performed under the following conditions. The pump pressure of the pump 42 is set to 9 MPa (gauge pressure), and the pressure of the chemical fluid MF to be sprayed from the nozzle head 44 is set to 3 to 20 MPa (gauge pressure). The distance between the nozzle head 44 and the front side WS of the wafer W is set to 20 to 70 mm. The rotational speed of the chuck table 41 is set to 200 rpm. The swing speed of the chemical fluid nozzle 43 is set to 20 to 50 mm/second. The use rate of the chemical fluid MF is set to 0.2 to 1 liter/minute. The cleaning time is set to 30 to 200 seconds. After performing the resist film removing step, the grinding step is performed.

Figure 7:
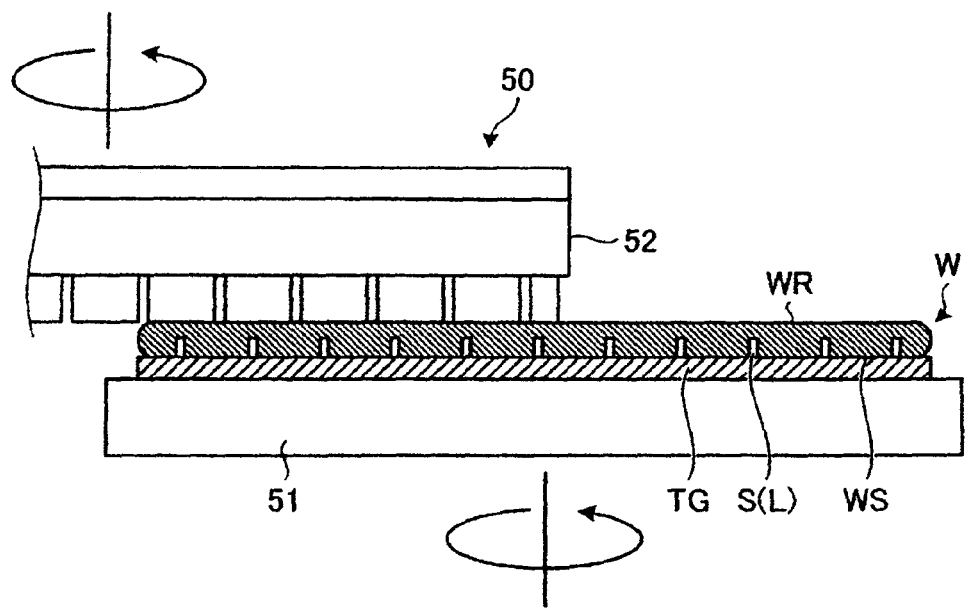
FIG. 7 is a partially sectional side view showing a grinding step.

Referring to FIG. 7, the grinding step is the step of grinding the back side WR of the wafer W to reduce the thickness of the wafer W to the finished thickness T (see FIG. 8), thereby dividing the wafer W into the individual device chips DT respectively including the devices D. The grinding step is performed by using a grinding apparatus 50 shown in FIG. 7. The grinding apparatus 50 includes a chuck table 51 for holding the wafer W under suction and a grinding wheel 52 (corresponding to grinding means) for grinding the wafer W held on the chuck table 51. First, a protective tape TG is attached to the front side WS of the wafer W, and the protective member G is removed from the back side WR of the wafer W. Thereafter, the wafer W is placed on the chuck table 51 in the condition where the protective tape TG is in contact with the upper surface of the chuck table 51, that is, the back side WR of the wafer W is exposed. Thereafter, the wafer W is held under suction on the chuck table 51. Thereafter, the grinding wheel 52 is rotated about its axis, and the chuck table 51 is also rotated about its axis. Thereafter, the grinding wheel 52 is positioned above the chuck table 51 and next gradually lowered until coming into contact with the back side WR of the wafer W as supplying a grinding water through a nozzle (not shown) formed in the grinding wheel 52 toward the back side WR of the wafer W. Then, the grinding wheel 52 is fed downward to grind the back side WR of the wafer W.

Figure 8:
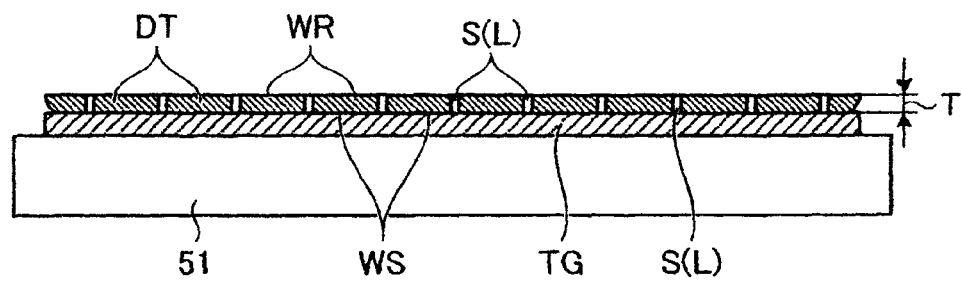
FIG. 8 is a sectional view of the wafer processed by the grinding step.

In this manner, the back side WR of the wafer W is ground by the grinding wheel 52 to thereby reduce the thickness of the wafer W to the finished thickness T. When the thickness of the wafer W reaches the finished thickness T, the grinding wheel 52 is raised away from the chuck table 51, and the suction holding of the wafer W on the chuck table 51 is canceled. The depth of each groove S is greater than the finished thickness T as described above. Accordingly, when the thickness of the wafer W reaches the finished thickness T, each groove S is exposed to the back side WR of the wafer W as shown in FIG. 8. As a result, the wafer W is divided into the individual device chips DT by the grooves S exposed to the back side WR of the wafer W as shown in FIG. 8. At this time, the back side WR of the wafer W becomes the back side WR of each device chip DT, and the front side WS of the wafer W becomes the front side WS of each device chip DT. After performing the grinding step, the tape attaching step is performed.

Figure 9:
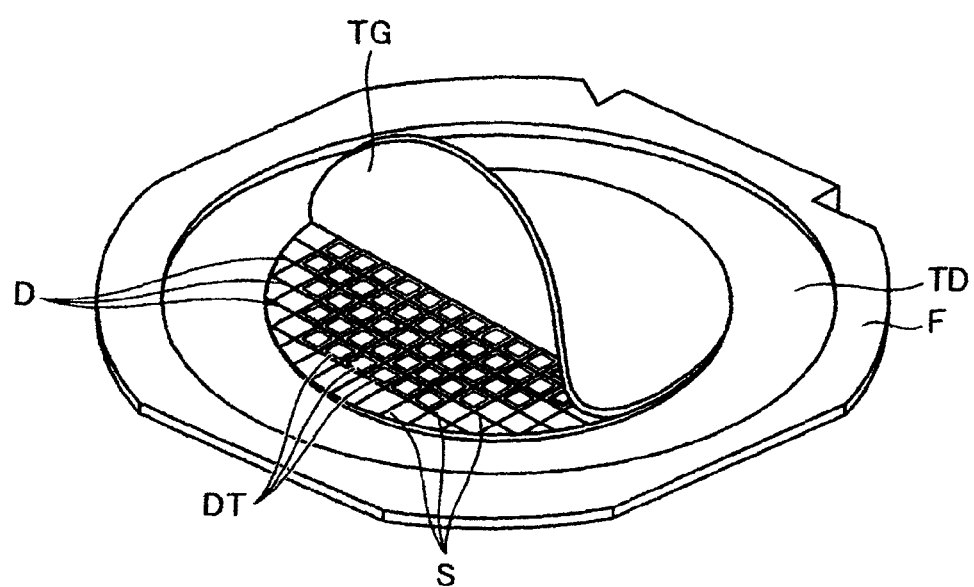
FIG. 9 is a perspective view showing a tape attaching step.

Referring to FIG. 9, the tape attaching step is the step of attaching a dicing tape TD to the back side WR of the wafer W, i.e., the back side WR of each device chip DT, wherein the dicing tape TD is supported at its periphery to an annular frame F. First, the dicing tape TD is attached to the back side WR of the wafer W divided into the individual device chips DT. Simultaneously with or after this tape attachment operation, the annular frame F is attached to the peripheral portion of the dicing tape TD. Thereafter, the protective tape TG is peeled from the front side WS of the wafer W divided into the individual device chips DT as shown in FIG. 9. Thereafter, each device chip DT is transferred to the next step.

In the tape attaching step, an adhesive film (not shown) for die bonding may be attached to the back side WR of the wafer W divided into the individual device chips DT, before attaching the dicing tape TD. The adhesive film for die bonding is a special bonding film to be used in mounting or stacking the device chips DT. After attaching the adhesive film for die bonding, the dicing tape TD is attached to the adhesive film for die bonding. Thereafter, the protective tape TG is peeled from the front side WS of the wafer W. Thereafter, a laser beam is applied from the front side WS of the wafer W through the grooves S to the adhesive film exposed to the grooves S, i.e., to the spacing between the device chips DT.

Alternatively, the dicing tape TD may be expanded. As a result, the adhesive film is divided along the grooves S into parts respectively attached to the individual device chips DT.

According to the wafer processing method described above, the resist film R is removed by a very simple operation of spraying the chemical fluid MF in the resist film removing step after performing the plasma etching step. Accordingly, it is unnecessary to perform ashing for the resist film R or immerse the resist film R left after ashing in the chemical fluid MR, so that the resist film R can be removed at a low cost without causing damage to the devices D and increasing the time required.

Further, the chemical fluid MF is alcohol such as isopropyl alcohol in this preferred embodiment. Accordingly, the resist film R can be removed reliably. Moreover, an increase in cost for the chemical fluid MF can be suppressed, so that the resist film R can be removed at a low cost.

Further, in the case that the chemical fluid MF is dimethyl sulfoxide, N-methyl pyrrolidone, or dipropylene glycol methyl ether, all of which are chemicals conventionally used to remove a resist film R slightly left after ashing, the resist film R can be removed reliably and the chemical fluid MF is easily available.

The present inventors made tests to confirm the effect of the present invention. The results of the tests are shown in Table 1.

TABLE 1

|  | Required time | Damage to the devices |
| --- | --- | --- |
| Invention No. 1 | Short | Absent |
| Invention No. 2 | Short | Absent |
| Invention No. 3 | Short | Absent |
| Comparison No. 1 | Long | Absent |
| Comparison No. 2 | Short | Present |

In Comparison No. 1, ashing was performed so as to slightly leave the resist film R, and the resist film R thus slightly left was immersed in the chemical fluid MF to thereby remove the resist film R in the resist film removing step. In Comparison No. 2, only ashing was performed to remove the resist film R in the resist film removing step. In Invention No. 1, the resist film removing step in this preferred embodiment described above was performed.

In Invention No. 1, isopropyl alcohol was used as the chemical fluid MF in the resist film removing step. The pump pressure of the pump 42 was set to 9 MPa (gauge pressure) to supply the chemical fluid MF. The pressure of the chemical fluid MF to be sprayed from the nozzle head 44 was set to 10 MPa (gauge pressure). Further, in Invention No. 1, the distance between the nozzle head 44 and the front side WS of the wafer W was set to 30 mm. The rotational speed of the chuck table 41 was set to 200 rpm. The swing speed of the chemical fluid nozzle 43 was set to 30 mm/second. The cleaning time was set to 20 seconds.

In Invention No. 2, dimethyl sulfoxide was used as the chemical fluid MF in the resist film removing step. The pump pressure of the pump 42 was set to 9 MPa (gauge pressure) to supply the chemical fluid MF. The pressure of the chemical fluid MF to be sprayed from the nozzle head 44 was set to 10 MPa (gauge pressure). Further, in the Invention No. 2, the distance between the nozzle head 44 and the front side WS of the wafer W was set to 30 mm. The rotational speed of the chuck table 41 was set to 200 rpm. The swing speed of the chemical fluid nozzle 43 was set to 30 mm/second. The cleaning time was set to 20 seconds.

In Invention No. 3, N-methyl pyrrolidone was used as the chemical fluid MF in the resist film removing step. The pump pressure of the pump 42 was set to 9 MPa (gauge pressure) to supply the chemical fluid MF. The pressure of the chemical fluid MF to be sprayed from the nozzle head 44 was set to 10 MPa (gauge pressure). Further, the distance between the nozzle head 44 and the front side WS of the wafer W was set to 30 mm. The rotational speed of the chuck table 41 was set to 200 rpm. The swing speed of the chemical fluid nozzle 43 was set to 30 mm/second. The cleaning time was set to 20 seconds.

In the tests, the required time for the resist film removing step and the damage to the devices D were checked. As apparent from Table 1, in Comparison No. 1, no damage is caused to the devices D. However, the required time is as long as 60 seconds. In Comparison No. 2, the required time is as short as 30 seconds, but damage is caused to the devices D. To the contrary, all of Inventions Nos. 1 to 3 have advantages that the required time is as short as 30 seconds and no damage is caused to the devices D. Thus, the effect of the present invention becomes clear from Table 1. That is, by using alcohol such as isopropyl alcohol or any other chemicals conventionally used to remove the resist film R slightly left after asking as the chemical fluid MF according to the present invention and then spraying the chemical fluid MF toward the front side WS of the wafer W under pressure, the resist film R can be removed without causing an increase in cost and man-hour.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer having a plurality of devices each formed in a plurality of separate regions defined by a plurality of crossing division lines on a front side of said wafer, said wafer processing method comprising:
   a resist film forming step of forming a resist film on the front side of said wafer in an area except said division lines;
   a plasma etching step of performing plasma etching to said wafer after performing said resist film forming step, thereby forming a groove on the front side of said wafer along each division line, said groove having a depth greater than a finished thickness;
   a resist film removing step of removing said resist film from the front side of said wafer by cleaning after performing said plasma etching step; and
   a grinding step of holding said wafer on a chuck table in a condition where a back side of said wafer is exposed after performing said resist film removing step, and grinding the back side of said wafer held on said chuck table to reduce the thickness of said wafer to said finished thickness, whereby said groove is exposed to the back side of said wafer to thereby divide said wafer into a plurality of individual device chips each corresponding to said devices,
   wherein said resist film removing step includes the step of spraying a chemical fluid to said resist film formed on the front side of said wafer, thereby removing said resist film.

2. The wafer processing method according to claim 1, wherein said chemical fluid is alcohol.

3. The wafer processing method according to claim 1, wherein said chemical fluid is selected from the group consisting of dimethyl sulfoxide, N-methyl pyrrolidone, and dipropylene glycol methyl ether.

* * * * *